United States Patent [19]

Strangman

[11] 4,405,659
[45] Sep. 20, 1983

[54] METHOD FOR PRODUCING COLUMNAR GRAIN CERAMIC THERMAL BARRIER COATINGS

[75] Inventor: Thomas E. Strangman, Phoenix, Ariz.

[73] Assignee: United Technologies Corporation, Hartford, Conn.

[21] Appl. No.: 327,305

[22] Filed: Dec. 4, 1981

Related U.S. Application Data

[62] Division of Ser. No. 109,956, Jan. 7, 1980, Pat. No. 4,321,311.

[51] Int. Cl.$^3$ .................... C23C 11/00; C23C 13/00
[52] U.S. Cl. ............................... 427/248.1; 427/34; 427/250; 427/328; 427/367; 427/380; 427/405; 427/419.2; 427/419.3; 427/419.7
[58] Field of Search .............. 427/248.1, 34, 280, 427/376.4, 367, 405, 419.7, 419.2, 419.3, 372.2, 379, 380, 328, 376.8; 148/6.3, 11.5 R, 11.5 F, 31.5, 13; 428/623, 629, 633, 678, 926

[56] References Cited

U.S. PATENT DOCUMENTS

| | | | |
|---|---|---|---|
| 3,528,861 | 9/1970 | Elam et al. | 148/11.5 F |
| 3,837,894 | 9/1974 | Tucker | 428/632 |
| 3,873,347 | 3/1975 | Walker et al. | 427/405 |
| 3,890,456 | 6/1975 | Dils | 428/632 |
| 4,024,294 | 5/1977 | Rairden | 427/42 |
| 4,095,003 | 6/1978 | Weatherly et al. | 428/632 |
| 4,101,715 | 7/1978 | Rairden | 427/405 |
| 4,109,031 | 8/1978 | Marscher | 427/191 |
| 4,110,893 | 9/1978 | Elam et al. | 427/250 |
| 4,145,481 | 3/1979 | Gupta et al. | 427/250 |
| 4,273,824 | 6/1981 | McComas et al. | 427/250 |

OTHER PUBLICATIONS

Fairbanks, "Proceedings of 1974 Gas Turbine Materials in the Marine Environment Conference", MCIC Report, Jun. 1975.
Busch, "Develop Sputter Deposited Graded Metal-$ZrO_2$ Coating", Battelle Pacific Northwest Lab. Contract No. N00024-75-C-4333, pp. 1-23, 1976.
Boone et al. "Some Effects of Structure and Composition . . . " J. Vac. Sci. Technol., vol. 11, No. 4, pp. 641-646, Jul./Aug. 1974.
Bunshah, "High-Rate Evaporation/Deposition Processes . . . " J. Vac. Sci. Technol., vol. 11, No. 4, pp. 814-819, Jul./Aug. 1974.
Stecura, "Effects of Compositional Changes on the Performance of a Thermal Barrier Coating System" NASA Tech. Mem. 78976, 1979.
"Plasma Deposited MCrAlY Airfoil & Zirconia/MCrAlY Thermal Barrier Coatings " Union Carbide, 1976.

Primary Examiner—S. L. Childs
Attorney, Agent, or Firm—Charles E. Sohl

[57] ABSTRACT

A coated article and method for producing the coated article are described. The article is coated with a system which provides protection against oxidation and corrosion and which significantly reduces the substrate temperature. An MCrAlY layer is applied to the article to be protected and a columnar grain ceramic is applied by vapor deposition to the MCrAlY coated article. An alumina layer which exists between the MCrAly layer and the columnar ceramic layer provides for the adherence of the columnar layer to the MCrAlY layer.

9 Claims, 3 Drawing Figures

METHOD FOR PRODUCING COLUMNAR GRAIN CERAMIC THERMAL BARRIER COATINGS

This is a division of application Ser. No. 109,956 filed on Jan. 7, 1980, now U.S. Pat. No. 4,321,311.

DESCRIPTION

1. Technical Field

This invention is concerned with the field of ceramic coatings on metal substrates. The coating and method described in the present application are useful for the application of protective ceramic thermal barrier coatings to gas turbine engine components. Through the use of the present coating, substantial increases in turbine operating temperatures may be possible.

2. Background Art

This application is similar in some respects to U.S. Ser. No. 109,956, now U.S. Pat. No. 4,321,311 (Columnar Grain Ceramic Thermal Barrier Coating On Polished Substrates) by D. Ruckle and N. Ulion filed on even date herewith.

The superalloy art has long sought to combine the properties of ceramics with the properties of metals. Thus for example, many attempts have been made to provide protective ceramic coatings to metal articles which find application at elevated temperatures so as to combine the thermal properties of ceramics with the ductility of metals.

The primary problem which has not been successfully solved heretofore is that the substantial difference in the coefficient of thermal expansion of metals and ceramics invariably leads to failure of ceramic coatings under conditions of severe thermal cycling.

One approach which has been employed in an effort to overcome this problem is that of grading the coating from essentially all metal at the metal surface to all ceramic at the outer surface of the coating. In this way it is believed that the coefficient of thermal expansion will change gradually through the coating thickness and the stress resulting from thermal cycling will not be sufficient to cause damage to the coating. Such an approach is described in U.S. Pat. No. 3,091,548 to Dillon. The problem with the graded approach is that the discrete metal particles in the graded coating oxidize and increase in volume producing unacceptable stresses in the coating.

In the general area of metal-ceramic combinations, it is known to use segmented ceramic pieces such as tiles which are bonded to metal structures for their protection. In this approach, which is generally applied to large articles, the segments are not bonded to each other, and the gaps between the tiles permit accommodation of the thermal expansion of the metal. Such an approach (the application of individual segments) would not be practical in the case of gas turbine engine components in which extreme operating conditions will be encountered and which a multiplicity of small complex parts must be coated at a reasonable cost. Additionally, in the use of such a segmented ceramic approach, there still remains the problem of obtaining a good metal-ceramic bond.

In a different art area, it is known to apply coatings of ceramics and metals by vapor deposition. The general subject of vapor deposition is described in an article by R. F. Bunshah "Journal of Vacuum Science of Technology, "Vol. 11, No. 4, July/August 1974. The application of ceramics by vapor deposition is employed chiefly in the semiconductor and optics industries where extremely thin coatings are used.

In vapor deposition, the article to be coated is held over a molten pool of material of appropriate composition which evaporates, and the vapor condenses on and coats the article. This process is used in a variety of applications including the application of metallic coatings to gas turbine engine parts. The application to gas turbine engine arts is described in the "Journal of Vacuum Science of Technology," Vol. 11, No. 4, July/August 1974, pgs. 641 through 646 in an article by Boone et al.

This article also describes the types of defects which can occur in vapor deposited coatings. The most significant defect described is termed a "columnar defect" in which the coating forms as columnar grains which are poorly bonded to each other. Such a structure is described as being detrimental because the exposed columnar surface greatly increased the surface exposed to the environment and because the gaps between the columns may adversely affect mechanical properties. The article indicates that practical uses of vapor deposited coatings requires that the columnar type of structure be minimized.

A paper entitled "High Rate Sputtered Deposition of Protective Coatings on Marine Gas Turbine Hot Section Superalloys," authored by J. Fairbanks et al was presented in July 1974 at a conference on "Gas Turbine Materials in the Marine Environment" and was subsequently presented as a report by the Metals Information Center of the Department of Defense (MCIC 75-27). The paper indicates that columnar growth defects were observed in sputtered ceramic coatings. The paper hypothesizes that a coating with a columnar structure might permit stress relaxation of the coating and thereby enhance coating life.

Subsequent development of this concept by one of the authors is detailed in NASA Report NASA-CR-159412 issued July 19, 1978. This report describes the sputter deposition of zirconia based columnar coatings on copper substrates. The investigation was not successful in producing a coating which could withstand cycling between $-196°$ F. and $400°$ F. The investigators also performed experiments in which a titanium interlayer was deposited prior to the ceramic deposition. However, the resultant coatings spalled under conditions of moderate thermal cycling. In the conclusion of the report, the investigator indicated that the coating performance was substantially less than that observed in previous work using graded coatings. The same investigator also performed work for the Naval Sea Systems Command on graded metal-ceramic coatings applied by sputtering in which columnar coatings were produced. These coatings were unsuccessful in resisting spalling under conditions of severe thermal cycling. The report is entitled "Develop Sputter Deposited Graded Metal $ZrO_2$ Coating Technology for Application to Turbine Hot Section Components," Contract No. N00024-75-C-4333, Oct. 11, 1976.

Ceramic coatings have also been applied by a plasma spray process. The most successful plasma spray coatings to date have been applied to articles which have been previously coated with a metallic bond coat. Among the bond coats investigated have been the MCrAlY class of materials. In this situation, the bond coat appears to function by acting as a soft, rough layer in which the plasma spray particles are embedded forming a mechanical bond. This is described in U.S. Pat.

No. 4,055,705 and pending application U.S. Ser. No. 811,807 (now U.S. Pat. No. 4,248,940) which pending application has been the prevailing application in Interference No. 100,011.

DISCLOSURE OF INVENTION

The present invention includes a composite coating system which protects metallic articles from environmental damage especially under conditions of high temperature. The novel application method also forms a part of the present invention.

The article to be protected is supplied with a uniform adherent MCrAlY layer. On this MCrAlY layer, there is applied a ceramic coating having a particular novel columnar microstructure.

The ceramic coating is comprised of many individual columnar segments which are firmly bonded to the article to be protected, but not to each other. By providing gaps between the columnar segments, the metallic substrate may expand without causing damaging stresses in the ceramic.

The ceramic coating is applied by a vapor deposition process. A continuous alumina layer is present between the MCrAlY component and the columnar ceramic coating. This alumina layer plays a crucial role in bonding the ceramic coating to the MCrAlY layer.

BRIEF DESCRIPTION OF DRAWINGS

The details of the invention will be described along with the accompanying drawings.

BEST MODE FOR CARRYING OUT THE INVENTION

Figure 1:
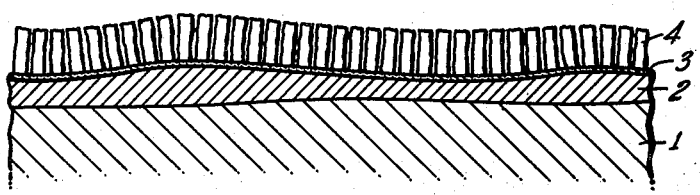
FIG. 1 is a cross sectional line drawing showing the invention coating.

The thermal barrier coating system of the present invention is a composite coating which includes three interrelated elements which perform different functions. The performance of the coating system is superior to that of any other known high temperature coating when evaluated in gas turbine engine environments. The invention coating system provides oxidation and corrosion protection equal to that of best current coatings in combination with significant thermal barrier or insulating capabilities.

The major use of the invention coating is in the protection of superalloy articles. Superalloys are nickel, cobalt, and iron base alloys which have exceptional properties at elevated temperatures. Typical compositions are listed in Table 1.

ceramic layer of a particular columnar morphology on the alumina layer.

The metallic layer is comprised of a MCrAlY alloy which has a broad composition of 10 to 30% chromium, 5 to 15% aluminum, 0.01 to 1% yttrium (or hafnium lanthanum, cerium and scandium) and the balance ("M") selected from the group consisting of iron, cobalt, nickel and mixtures thereof. Minor amounts of other elements may also be present. Such alloys are known in the prior art for use alone as a protective coating and are described in various U.S. patents including U.S. Pat. Nos. 3,542,530; 3,676,085; 3,754,903 and 3,928,026 which are incorporated herein by reference.

This invention also contemplates the use of various interlayers between the superalloy substrate and the MCrAlY layer. In particular, it is known from U.S. Pat. No. 4,005,989 that the use of an aluminide layer (produced by aluminizing) between a substrate and a MCrAlY layer can provide improved coating durability. Other materials such as platinum have also been proposed for interlayer use. Of course, such interlayers will be used only where necessary and only where they do not adversely affect the bond between the substrate and the MCrAlY.

It is preferred that this MCrAlY layer be applied by vapor desposition. Such a deposition process in combination with peening and heat treating provides a dense adherent layer of relatively uniform thickness which is basically free from defects. A thickness of 1–10 mils is suitable.

Other deposition processes may be employed for producing the MCrAY layer including sputtering and plasma spraying, possibly with associated post coating treatments, so long as they produce a uniform thickness high integrity coating of the desired composition.

The alumina layer on the MCrAlY layer is produced by oxidation of the MCrAlY layer. This oxide layer is relatively thin (0.01–0.1 mil), uniform and adherent. Adherence of the oxide layer is greatly improved in MCrAlY alloys compared to that of similar alloys which do not contain yttrium or similar active elements. This improved adherence results from the formation of yttrium oxides which extend into the MCrAlY and are bonded to the alumina surface layer thus anchoring the surface layer and minimizing spalling.

The adherence of the alumina layer is essential to the adherence of the columnar ceramic layer and the presence of yttrium or equivalent oxygen active elements such as lanthanum, cerium, hafnium, and scandium or mixtures or oxide particles thereof, in the metallic coating, is important to the proper functioning of the invention coating system.

TABLE 1

|         | Cr | Co  | Al  | Ti  | Mo  | W    | Ta  | Cb  | V   | C   | Fe  | Ni  |
|---------|----|-----|-----|-----|-----|------|-----|-----|-----|-----|-----|-----|
| IN 100  | 10 | 15  | 5.5 | 4.7 | 3.0 | —    | —   | —   | 1.0 | .18 | —   | Bal |
| MAR M200| 9  | 10  | 5.0 | 1.0 | —   | 12.5 | —   | 1.0 | —   | .15 | —   | Bal |
| MAR M509| 24 | Bal | —   | .2  | —   | 7    | 7.5 | —   | —   | .6  | 1.0 | 10  |
| WI 52   | 21 | Bal | —   | —   | —   | 11   | —   | 2   | —   | .45 | 2   | —   |

The invention thermal barrier coating has a major use in gas turbine engines and was developed with this application in mind. However, there are many other potential applications for which this coating or some variation thereof would be well-suited.

The coating consists of a metallic layer of MCrAlY alloy, a continuous adherent alumina layer (formed in situ) on the metallic layer and a discontinuous pure The final component of the thermal barrier coating is a unique columnar grained surface coating which is tightly bonded to the alumina layer. The columnar grains are oriented substantially perpendicular to the surface of the substrate with free surfaces between the individual columns extending down to the aluminum oxide layer.

The columnar ceramic surface layer is a pure ceramic as distinguished from some prior art which has suggested the use of a graded layer incorporating substantial amounts of metal in the coating.

The columnar nature of the surface layer circumvents the difference in the coefficients of thermal expansion between the substrate and the coating which is believed responsible for failure in prior art ceramic thermal barrier coatings. Upon heating, the substrate expands at a greater rate than the ceramic surface coating and the columnar boundaries between the individual ceramic columns open to accommodate mismatch strains. This limits the stress at the interface between the substrate and the columnar ceramic to a level below that which will produce a fracture of a columnar surface layer. The columns have dimensions on the order of 0.1 mil in cross section.

The columnar surface layer may be any of many ceramic compositions. Most of the experimental work to date has been performed with a ceramic composed of zirconium oxide stabilized by the addition of either 20 or 35% yttria to ensure a cubic structure at all temperatures of interest.

It is difficult to specify exactly the characteristics required in the ceramic material used as the columnar coating. It appears that there should be some degree of solid solubility between the columnar ceramic material and alumina. This is believed to be the major criteria which most affects the adherence of the columnar ceramic coating to the alumina layer. Other characteristics are also necessary. The columnar ceramic material should not form low melting compounds (e.g. eutectics) when in cnntact with alumina at elevated temperatures. The melting point (and sublimation point) of the columnar ceramic material should be substantially greater than the service temperature.

Finally, the columnar ceramic material should be stable in the intended environment; i.e., the material should not oxidize or otherwise react with the environment to any significant extent (some ceramics such as $Si_3N_4$ will oxidize at elevated temperatures but the oxidation is self limiting since the oxide produced ($SiO_2$) protects against further oxidation). The following ceramics are believed to have utility as the columnar coating material of the present invention: zirconia (preferably stabilized with a material such as yttria), alumina, ceria, mullite, zircon, silica, silicon nitride, hafnia, and certain zirconates, borides and nitrides.

In summary, therefore, the columnar ceramic material should have some degree of solid solubility in alumina and should be stable in the intended use envrionment. I believe that the skilled artisan will have no difficulty in selecting an appropriate ceramic based on the previous guidelines.

The function of the MCrAlY layer is to adhere strongly to the substrate and to produce a strong adherent continuous oxide surface layer. The alumina surface layer so-produced protects the underlying MCrAlY layer and substrate against oxidation and hot corrosion and provides a firm foundation for the columnar gain ceramic surface layer.

The columnar grain ceramic surface layer reduces the temperature of the underlying substrate and coating layers. Because of the nature of many ceramics and the existence of the open boundaries between the columns, the ceramic surface layer is relatively transparent to oxygen and does not play a major role in reducing the oxidation of the underlying layers except to the extent that the reduction in the temperature of the underlying layers reduces the rate of oxidation. Preliminary indications are that a 5 mil thick $ZrO_2$ base coating can reduce substrate temperatures by from 50° to 200° F. under conditions typical of those found in current gas turbine engines with cooled blades.

The ceramic surface layer is also believed to play a role in reducing hot corrosion by acting as a barrier between the underlying MCrAlY layer and the various liquid and solid combustion products which can cause hot corrosion. The ceramic layer is also believed to be beneficial in protecting against hot corrosion by increasing the rate of evaporation of surface deposits in certain circumstances as a result of the high surface temperature of the ceramic which results from its thermal insulation capabilities.

Figure 2:
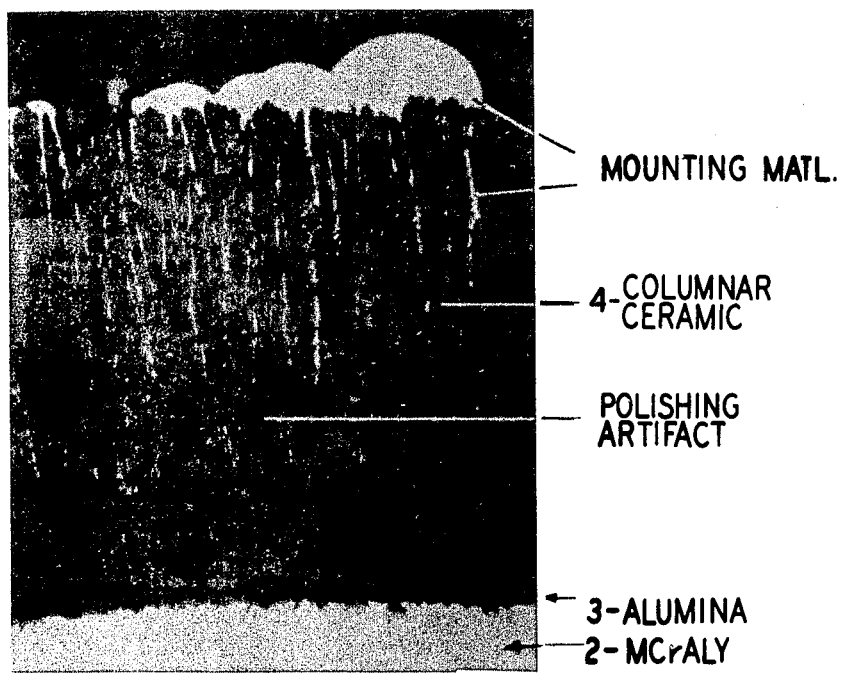
FIGS. 2 and 3 are a photomicrographs which show experimental coatings.

FIG. 1 shows a cross sectional line drawing of a coating according to the present invention. The substrate material 1 is coated with an MCrAlY layer 2. On this layer 2, there is formed an adherent alumina layer 3. Finally, a columnar ceramic layer 4 adheres to the alumina layer 3. FIG. 2 shows a representative photomicrograph. The numbers on FIG. 2 correspond to the numbers on FIG. 1.

Having described the structure of the coated article, we will now describe a preferred method of producing this coating on gas turbine components such as blades and vanes.

The initial step is the preparation of the surface to be coated. The surface must be clean of all dirt, grease, oxides and the like.

The cleaning method I have used is vapor honing in which an aqueous abrasive slurry is propelled against the surface to be cleaned with sufficient force to remove all extraneous material from the surface. Following this step, the surface is preferably vapor degreased. While this is a satisfactory cleaning process, numerous alternative processes are possible.

Next, the MCrAlY layer is applied. It is preferred that this MCrAlY layer be applied by vapor deposition. The deposition process is performed by holding the surface to be coated over a pool of molten MCrAlY material in a vacuum chamber. The heat source used to keep the MCrAlY molten is usually an electron beam.

The surface to be coated is preferably maintained at a temperature of about 1600°–1800° F. during the MCrAlY deposition process.

It is preferred that the MCrAlY layer have a thickness of about 1 to about 10 mils. MCrAlY thicknesses below about 1 mil do not provide adequate protection to the surface and thicknesses in excess of about 10 mils are prone to rippling during repeated thermal cycling.

In conventional MCrAlY practice, the coatings are dry glass bead peened to densify any voids and to improve the coating structure. Such peening is preferred, but has not been found essential.

The coating is then preferably heat treated at 1975° F. in hydrogen, however neither the time or temperature is particularly critical. I have used a 4-hour treatment to improve the adherence of the coating to the substrate.

In the particular preferred processing sequence, this hydrogen heat treatment also serves to develop the desired alumina layer. This oxidation occurs as a result of oxygen impurities in the hydrogen. I have also employed a separate oxidation step in air in the temperature range of about 500°–2000° F. and the results appear to be similar. This thermal oxidation process represents the preferred method of alumina development.

It also appears possible to develop the alumina layer after the deposit of the columnar grained ceramic layer. This is especially likely in the case of zirconia based ceramics which are quite transparent to oxygen. However formation of the alumina layer prior to the columnar grained ceramic layer deposition is preferred.

Following the application of the MCrAlY layer and the development of the oxide layer, the columnar grained ceramic surface layer is applied by a vapor deposition process.

The ceramic to be deposited is melted and maintained as a molten pool or evaporation source. We have used 10-20 mesh ceramic powder as a starting material although other starting forms are also satisfactory. The substrate to be coated is positioned over the evaporation source and is manipulated to produce a uniform coating thickness and to enhance the production of a columnar structure. The ceramic coating thickness may range from about 1 to about 50 mils.

During the ceramic coating cycle, it has been found desirable to maintain the substrate at a relatively low temperature, e.g., 1000°–1500° F. to provide a relatively coarse columnar structure and a relatively stoichiometric coating composition.

The coating of the invention is novel in the sense that the prior art has, in general, gone to some lengths to avoid the production of a columnar structure with intercolumnar gaps which have been regarded as coating defects. This invention utilizes what has heretofore been regarded as a coating defect to provide improved coating performance.

The present invention will be more readily understood by reference to the following illustrative examples.

EXAMPLE 1

The component which was coated was a first stage turbine blade from a JT9D gas turbine engine, a commercial aircraft engine of about 50,000 pounds thrust.

The blade was composed of alloy MAR M200 plus hafnium which has a nominal composition of 9% chromium, 10% cobalt, 12.5% tungsten, 1% columbium, 2% titanium, 5% aluminum, 1.5% hafnium, 0.015 % boron, 0.05% zirconium and 0.15% carbon.

In preparation for the application of MCrAlY coating, the cast blade was cleaned by a vapor honing using an aqueous slurry of −200 mesh silica propelled at a pressure of about 60 psi against the surface of the blade.

After vapor honing, the blade was vapor degreased and a 5 mil coating of NiCoCrAlY having a nominal composition of 18% chromium, 23% cobalt, 12.5% aluminum, 0.3% yttrium, balance nickel was deposited by electron beam vapor deposition in a vacuum chamber.

After application of the NiCoCrAlY coating, the blade was peened using fine glass beads propelled by air pressure. This process densifies the coating. The surface roughness after peening was 35–40 rms. After the peening, the coated article was heat treated at 1975° F. for 4 hours in hydrogen and cooled to room temperature. During this heat treatment an alumina layer formed on the MCrAlY coating.

Following the processig of the MCrAlY coating, the columnar ceramic was applied by vapor deposition; during coating the substrate was held at about 1,000° F. The ceramic applied was cubic $ZrO_2$ stabilized by 20 weight percent $Y_2O_3$. The starting ceramic was a 10–20 mesh powder.

The ceramic was melted by an electron beam and was maintained in a pool about 1 inch diameter. The blade was held about 5 inches over the pool and was rotated over the pool at a rate of about 3 rpm for a period of about 4 hours.

Figure 3:
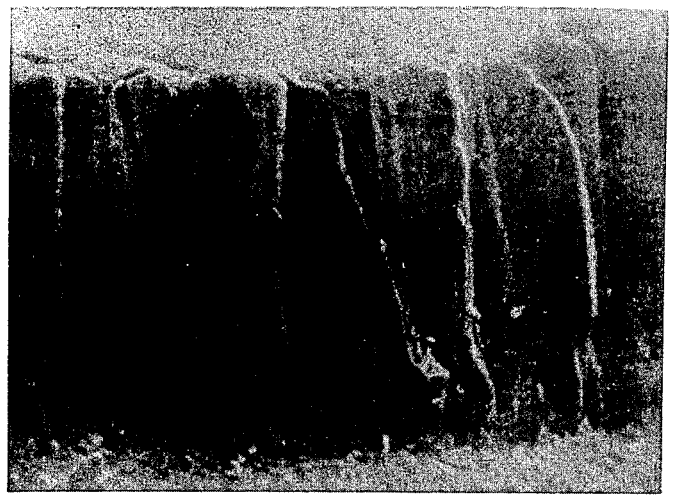

The resultant ceramic coating was about 5 mils in thickness and each of the columns had an average cross-sectional area of about 0.01 sq. mil. An optical micrograph of this ceramic coating structure is shown as FIG. 3.

These coated blades were then heat treated at 1600° F. for 32 hours. The purpose of this heat treatment was to assure that the $ZrO_2$ contained the stoichiometric amount of oxygen. The as deposited ceramic had a dark coloration, but after the heat treatment the ceramic layer had the light coloration which is typical of the stoichiometric ceramic.

The coated blades were installed in a test engine for an evaluation. The blades have accumulated approximately 100 hours of engine operating time and visual observation shows that the coating is in good condition.

EXAMPLE 2

Samples were coated and evaluated in a burner rig cycle thermal test. In this test, samples are mounted on a rotating platform and a flame formed by the combustion of jet fuel is impinged upon the samples. An instrument and control system is used to maintain the samples at a controlled temperature.

In the cycle used in this example, the samples were heated to and held at 1850° F. fo 4 minutes and then the flame was removed and a jet of cooling air was applied to cool the samples to below 400° F. in 2 minutes. This cycle was repeated until some sign of coating failure was observed.

One set of samples was prepared according to the preceding example except that no MCrAlY layer was applied, instead the vapor deposited columnar ceramic layer was applied directly to the clean superalloy substrate. The superalloy used was the same MAR M200 previously described.

The second set of sample was prepared using a plasma spray process to deposit a 0.005 inch thick layer of $ZrO_2$ on a 0.005 inch NiCoCrAlY layer which had been applied by vapor deposition. This process is consistent with the teachings of allowed U.S. application Ser. No. 811,807 filed June 30, 1977.

The third set of samples was repared according to the present invention. A 0.005 inch thick layer of NiCoCrAlY was applied by vapor deposition and a 0.005 inch thick layer of $ZrO_2$ was subsequently applied by vapor deposition. The processing sequence was identical to that described in the previous example.

The results of the burner rig tests using the previously described cycle were as follows. The first set of samples, those samples without the MCrAlY interlayer, failed in less than 200 cycles or 20 hours of testing.

The second set of samples, those in which the ceramic applied by plasma spraying, failed after 1210 cycles or 121 hours of burner rig testing.

The third set of samples, those made according to the present invention, have withstood more than 29,000 cycles or 2900 hours of testing without failure and the test is continuing.

The first two sets of samples failed by spallation of the ceramic from the sample. Comparison of the first sample set and third sample set clearly indicates the necessity of the MCrAlY intermediate layer if adherence of the ceramic layer is to be obtained. It appears that the provision of a MCrAlY interlayer improves the performance and adherence of the ceramic coating by a factor in excess of 100.

A comparison of the second and third set of samples demonstrate the significance of the particular ceramic structure and means of application of the ceramic layer. It can be seen that appyling a columnar ceramic layer by vapor deposition improves the coating life by a factor of at least 20 over the life of a ceramic layer of the same composition applied by plasma spray techniques.

I claim:

1. A method for producing a metallic article having a durable ceramic thermal barrier coating thereon, said method consisting essentially of:
   a. providing a superalloy substrate with a clean surface
   b. applying a thin adherent layer of MCrAlY to the clean surface
   c. developing a thin uniform adherent alumina layer on the MCrAlY layer
   d. applying a columnar ceramic coating to the alumina layer by vapor deposition.

2. A method as in claim 1 wherein the MCrAlY layer is applied by vapor deposition.

3. A method as in claim 1 wherein the MCrAlY layer has a thickness of about 1–10 mils.

4. A method as in claim 2 wherein the vapor deposited MCrAlY is subsequently peened.

5. A method as in claim 4 wherein the peened vapor deposited coating is subsequently heat treated.

6. A method as in claim 1 wherein the uniform adherent oxide layer is developed by thermal oxidation.

7. A method as in claim 1 wherein the thickness of the alumina layer is about 0.01 to about 0.1 mils.

8. A method as in claim 1 wherein the article is manipulated during application of the ceramic layer so as to encourage the formation of a columnar structure.

9. A method as in claim 1 wherein, after deposition of the columnar ceramic layer, the coated article is heat treated in an oxygen containing atmosphere so as to achieve a stoichiometric ceramic composition.

* * * * *